United States Patent
Hu

(10) Patent No.: US 9,015,561 B1
(45) Date of Patent: Apr. 21, 2015

(54) ADAPTIVE REDUNDANCY IN THREE DIMENSIONAL MEMORY

(71) Applicant: SanDisk Technologies Inc., Plano, TX (US)

(72) Inventor: Xinde Hu, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/301,497

(22) Filed: Jun. 11, 2014

(51) Int. Cl.
*G11C 29/00* (2006.01)
*G06F 11/10* (2006.01)

(52) U.S. Cl.
CPC ............ *G06F 11/1076* (2013.01); *G11C 29/76* (2013.01)

(58) Field of Classification Search
CPC . G06F 11/1076; G06F 11/08; G06F 11/1666; G11C 29/76
USPC .......................... 714/763–764, 769–770, 773
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 8,472,257 B2 | 6/2013 | Dong et al. | |
| 2011/0267885 A1 | 11/2011 | Kato | |
| 2011/0292725 A1* | 12/2011 | Choi et al. | ............... 365/185.03 |
| 2012/0220088 A1 | 8/2012 | Alsmeier | |
| 2013/0107628 A1 | 5/2013 | Dong et al. | |
| 2013/0268724 A1* | 10/2013 | Seo et al. | ....................... 711/103 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
U.S. Appl. No. 13/801,741 entitled "Weighted Read Scrub for Nonvolatile Memory," filed Mar. 3, 2013, 45 pages.
U.S. Appl. No. 13/791,200 entitled "Optimized Configurable NAND Parameters," filed Mar. 8, 2013, 37 pages.
U.S. Appl. No. 61/731,198, filed Nov. 29, 2012, 32 pages.
U.S. Appl. No. 61/731,215, filed Nov. 29, 2012, 42 pages.
U.S. Appl. No. 14/064,823, filed Oct. 28, 2013, 48 pages.
U.S. Appl. No. 14/064,887, filed Oct. 28, 2013, 42 pages.
U.S. Appl. No. 13/908,905, filed Jun. 13, 2013, 48 pages.

* cited by examiner

*Primary Examiner* — Shelly A Chase
(74) *Attorney, Agent, or Firm* — Davis Wright Tremaine LLP

(57) ABSTRACT

In a three-dimensional nonvolatile memory, physical layers are zoned according to expected error rate. Different redundancy schemes are applied to different zones so that a high degree of redundancy is applied to a zone with a high expected error rate and a low degree of redundancy is applied to a zone with a low expected error rate.

17 Claims, 14 Drawing Sheets

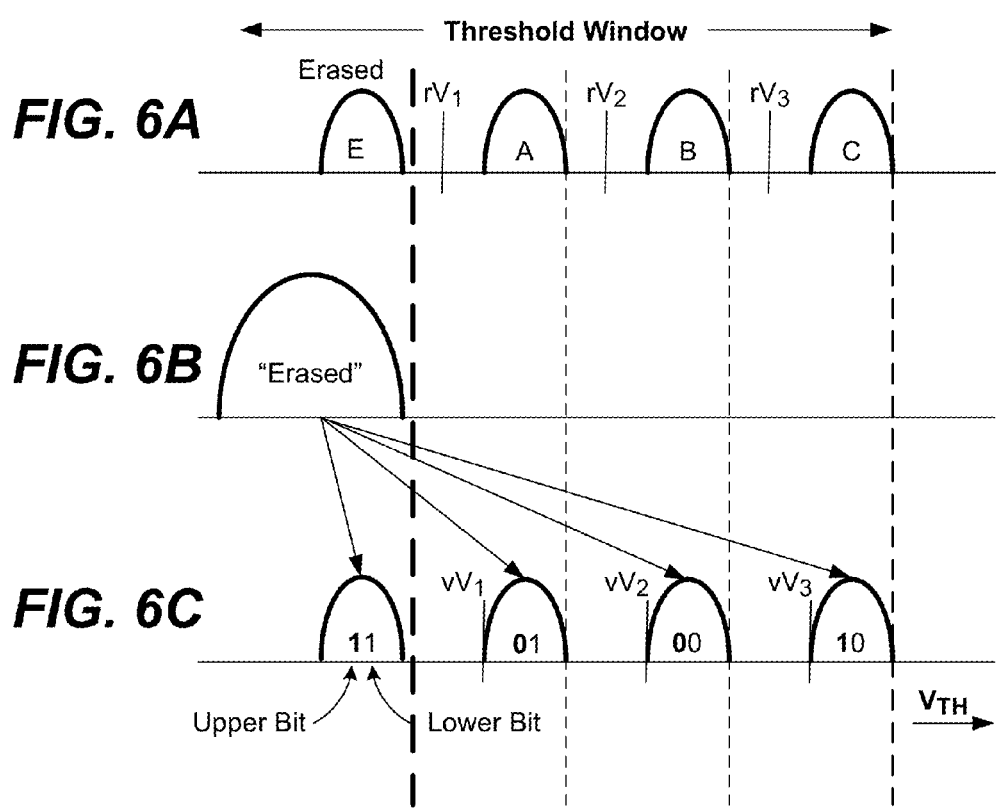
Programming into four states represented by a 2-bit code

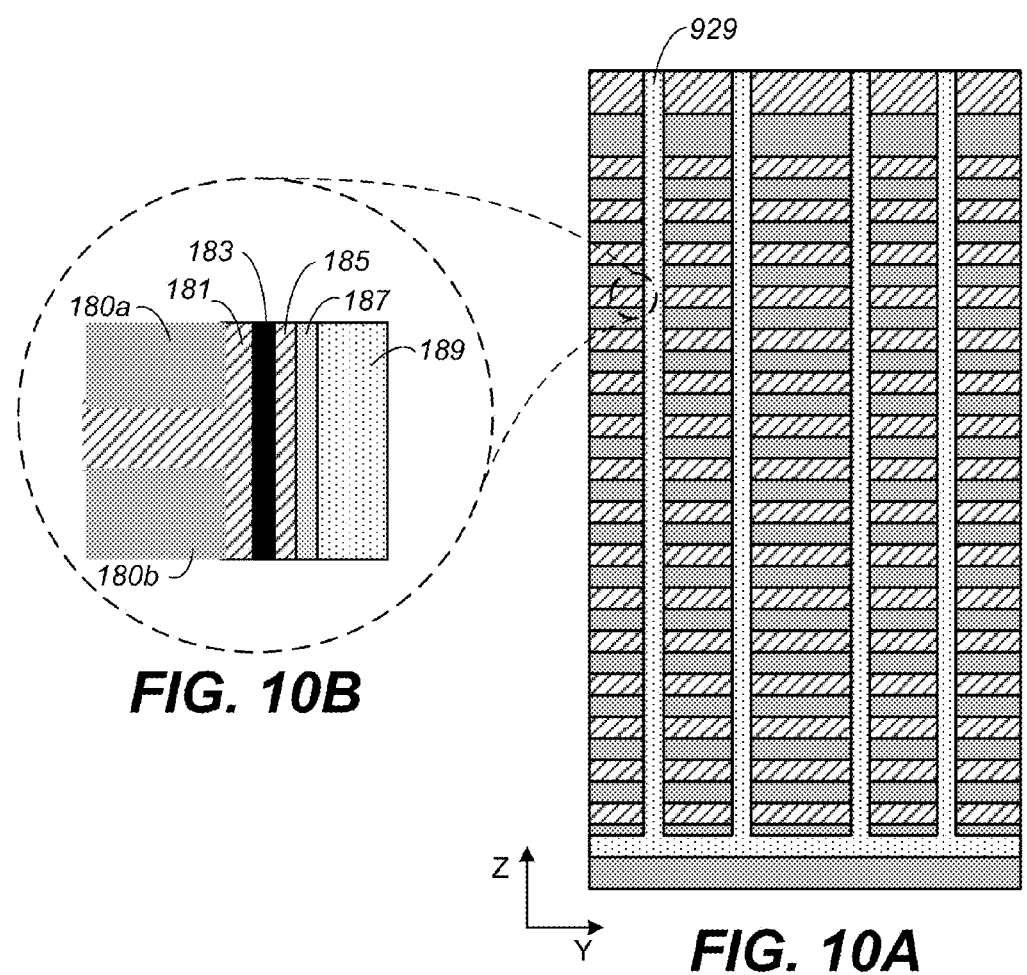

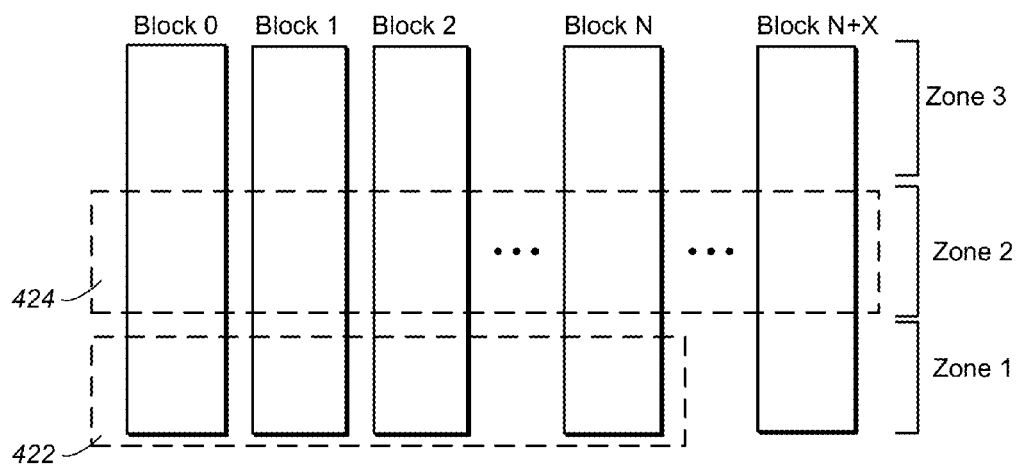
FIG. 14
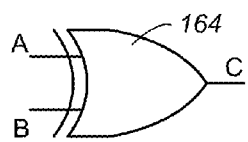
FIG. 15A
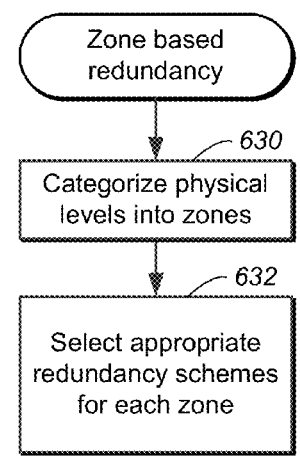
FIG. 15B
FIG. 16

ADAPTIVE REDUNDANCY IN THREE DIMENSIONAL MEMORY

BACKGROUND

This application relates to the operation of re-programmable nonvolatile three dimensional memory such as semiconductor flash memory, resistive memory (e.g. ReRAM), and other memories formed in multiple physical layers.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In addition to flash memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Resistive RAM (ReRAM) uses changes in electrical resistance of certain materials to record data. Various other nonvolatile memories are also in use or proposed for use in nonvolatile memory systems.

Many nonvolatile memories are formed along a surface of a substrate (e.g. silicon substrate) as two dimensional (2D), or planar, memories. Other nonvolatile memories are monolithically formed in one or more physical levels of memory cells having active areas disposed above a substrate.

SUMMARY OF THE INVENTION

In some 3-D memory arrays, memory cells are connected by memory hole structures that extend in a direction perpendicular to the substrate. Such structures tend to be nonuniform from top to bottom, which tends to produce different error rates for data stored in different physical levels. Such physical levels may be categorized according to expected error rates into two or more zones. Different degrees of redundancy may then be applied to the different zones so that the degree of redundancy is appropriate to the expected error rate with a higher degree of redundancy for a zone with a higher expected error rate. For example, RAID stripes may be sized according to the degree of redundancy required so that a RAID stripe in a particular zone is adapted for the expected error rate in that zone.

An example of a method of operating a three-dimensional nonvolatile memory that is monolithically formed in a plurality of physical levels of memory cells disposed above a substrate, memory cells in the plurality of physical levels connected in series to form vertical NAND strings, includes: categorizing the plurality of physical levels into at least a first category of physical levels and a second category of physical levels according to expected error rate, the first category of physical levels having a first expected error rate, the second category of physical levels having a second expected error rate that is less than the first expected error rate; performing a redundancy calculation for data in the first category of physical levels, across N blocks of the three-dimensional nonvolatile memory, to generate first redundant data; storing the first redundant data in a redundant block in the three-dimensional nonvolatile memory; performing a redundancy calculation for data in the second category of physical levels, across N+X blocks of the three-dimensional nonvolatile memory, to generate second redundant data; and storing the second redundant data in the redundant block.

The categorizing into at least the first category and the second category may include categorizing into a third category that has a third expected error rate that is less than the first and second expected error rates and no redundancy calculation may be performed for data in the third category of physical levels. X may be greater than or equal to N. The physical levels of the first category may be physically located below the physical levels of the second category. The third category of physical levels may include uppermost physical levels of the three-dimensional nonvolatile memory. Memory hole diameter may be less in the first category of physical levels than in the second category of physical levels. Performing the redundancy calculation for data in the first category of physical levels across N blocks may include performing an Exclusive OR (XOR) operation on user data in the first category of physical blocks across the N blocks to generate first XOR data. The XOR operation may subsequently be reversed in order to generate a copy of a portion of the user data from the first XOR data and from other portions of the user data. The subsequent reversing of the XOR operation may be performed in response to a determination that the portion of data in physical levels of the first category is uncorrectable by Error Correction Code.

An example of a three-dimensional nonvolatile NAND memory system includes: a three-dimensional nonvolatile NAND memory that is monolithically formed in a plurality of physical levels of memory cells disposed above a substrate, the plurality of physical levels including high risk physical levels in which there is a high risk of bad bits and low risk physical levels in which there is a low risk of bad bits; a plurality of memory hole structures extending vertically through the plurality of physical levels to connect memory cells of the plurality of physical levels into vertical NAND strings, the plurality of memory hole structures having small diameters in the high risk physical levels and having large diameters in the low risk physical levels; and a redundancy circuit that is configured to generate redundant data with different degrees of redundancy for high risk physical levels and low risk physical levels.

The redundancy circuit may include an exclusive OR (XOR) circuit on the substrate, which is configured to generate XOR data with different degrees of redundancy by XOR-ing different numbers of blocks for high risk physical levels and low risk physical levels. An Error Correction Code (ECC) circuit may be configured to encode data prior to storage in the three-dimensional nonvolatile NAND memory, configured to decode data that is read from the three-dimensional nonvolatile NAND memory, and configured to identify when data that is read from the three-dimensional NAND memory is uncorrectable. The redundancy circuit may be further configured to regenerate a portion of data when the portion of data is identified as uncorrectable by the ECC circuit. The three-dimensional NAND memory system may include: a redundant block that is dedicated to storage of redundant data; and a write circuit on the substrate that is configured to write the redundant data from the redundancy circuit in the redundant block. The plurality of physical levels may further include medium risk levels that are physically located between the high risk physical levels and the low risk physical levels, the medium risk levels having memory hole diameters that are intermediate between memory hole diameters in high risk physical levels and memory hole diameters in low risk physical levels.

An example of a method of operating a three-dimensional nonvolatile memory that is monolithically formed in a plurality of physical levels of memory cells disposed above a substrate, memory cells in the plurality of physical levels connected in series to form vertical NAND strings, includes: categorizing the plurality of physical levels into at least a first category of physical levels and a second category of physical levels according to expected error rate, the first category of physical levels having a first expected error rate, the second category of physical levels having a second expected error rate that is less than the first expected error rate, physical levels of the first category being physically located between physical levels of the second category and the substrate; performing a first Exclusive OR (XOR) calculation for data in the first category of physical levels, across N blocks of the three-dimensional nonvolatile memory, to generate first redundant data; storing the first redundant data in the three-dimensional nonvolatile memory; performing a second XOR calculation for data in the second category of physical levels, across N+X blocks of the three-dimensional nonvolatile memory, to generate second redundant data; and storing the second redundant data in the three-dimensional nonvolatile memory.

An example of a three-dimensional nonvolatile NAND memory system includes: a three-dimensional nonvolatile NAND memory that is monolithically formed in a plurality of physical levels of memory cells disposed above a substrate, the plurality of physical levels including high risk physical levels in which there is a high risk of bad bits and low risk physical levels in which there is a low risk of bad bits; a plurality of memory hole structures extending vertically through the plurality of physical levels to connect memory cells of the plurality of physical levels into vertical NAND strings, the plurality of memory hole structures having small diameters in the high risk physical levels and having large diameters in the low risk physical levels; an Error Correction Code (ECC) circuit that is configured to encode data prior to storage in the three-dimensional nonvolatile NAND memory, configured to decode data that is read from the three-dimensional nonvolatile NAND memory, and configured to identify when data that is read from the three-dimensional NAND memory is uncorrectable; and an XOR circuit that is configured to generate XOR data with different degrees of redundancy for high risk physical levels and low risk physical levels, and configured to regenerate a portion of data from XOR data when the ECC circuit identifies the portion of data as uncorrectable.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIGS. 10A-10B shows examples of structures of NAND strings.

FIG. 14 shows different degrees of redundancy for different zones in a three dimensional nonvolatile memory.

FIG. 15A illustrates an XOR gate.

FIG. 15B is a truth table for an XOR gate.

FIG. 16 illustrates a zone based redundancy scheme.

DETAILED DESCRIPTION

Memory System

Figure 1:
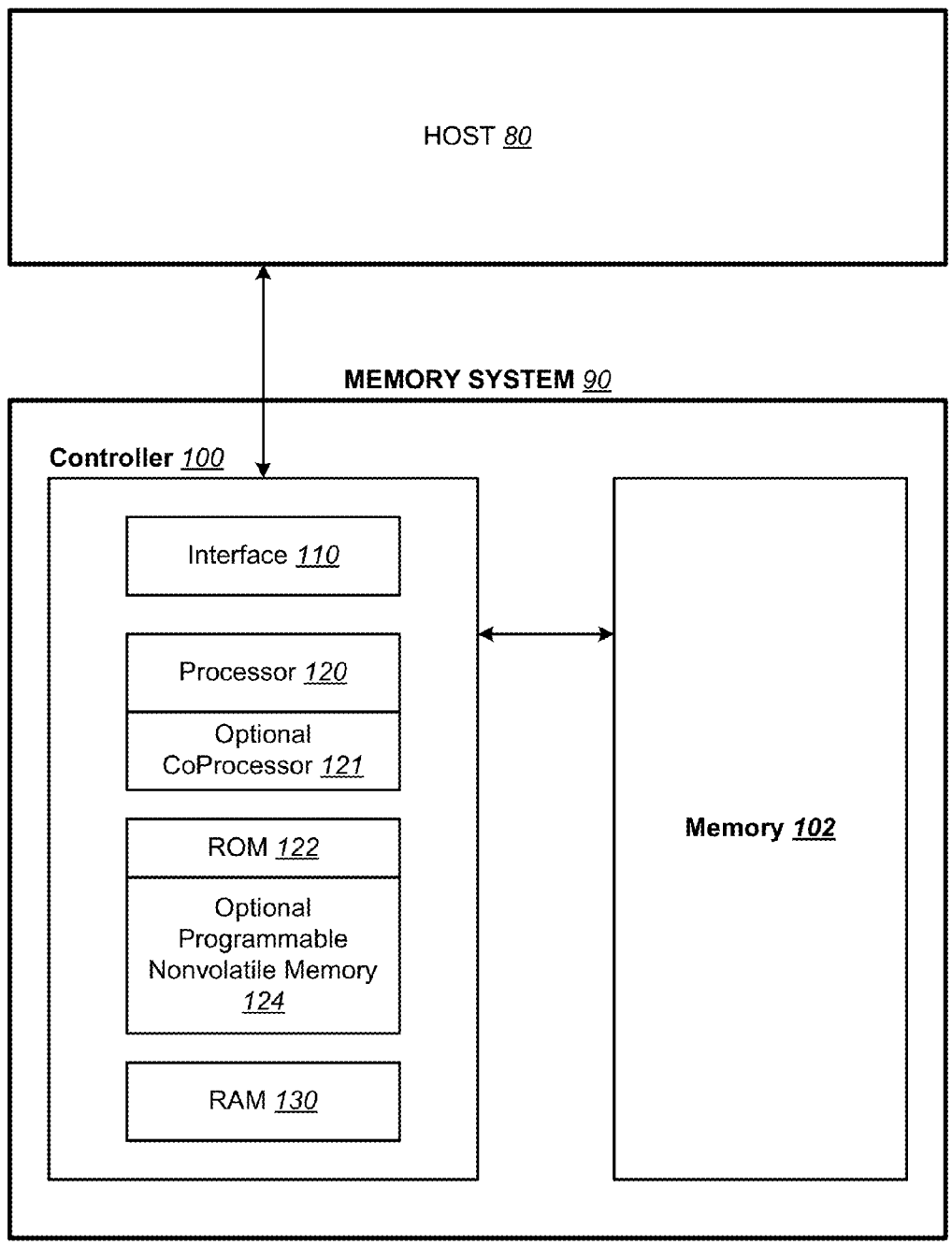
FIG. 1 illustrates schematically the main hardware components of a memory system suitable for implementing the present invention.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
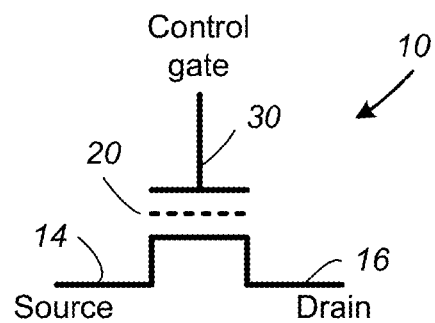
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
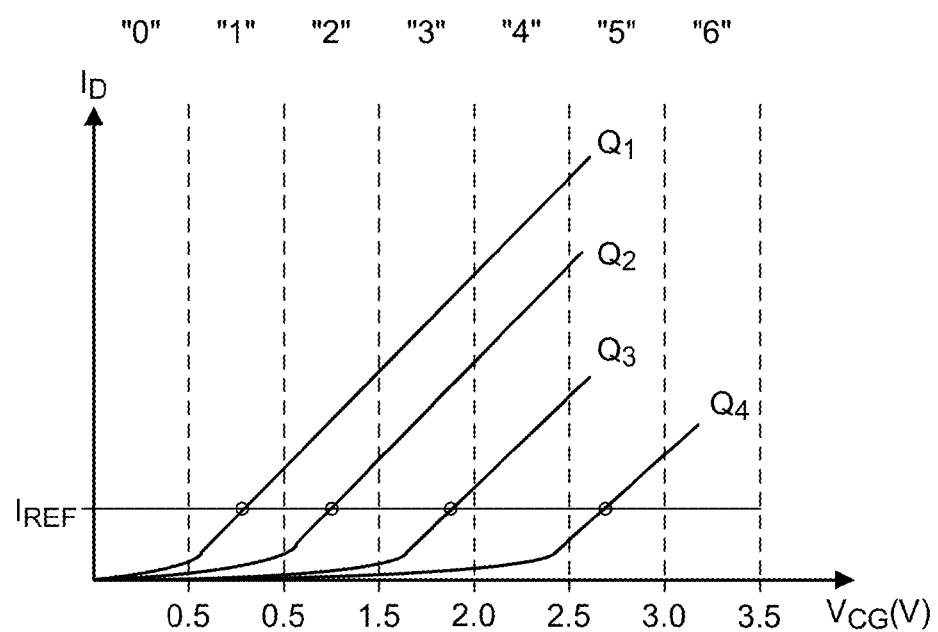
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
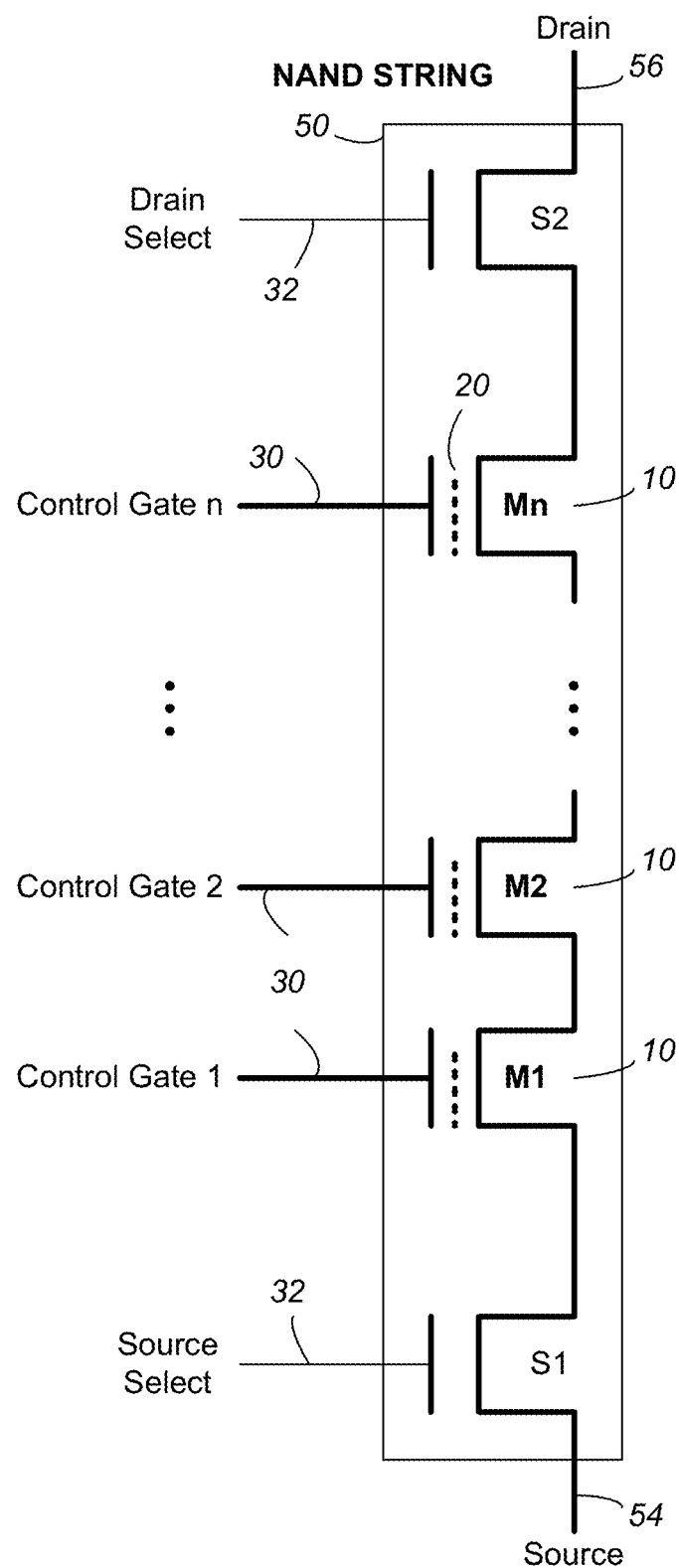
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
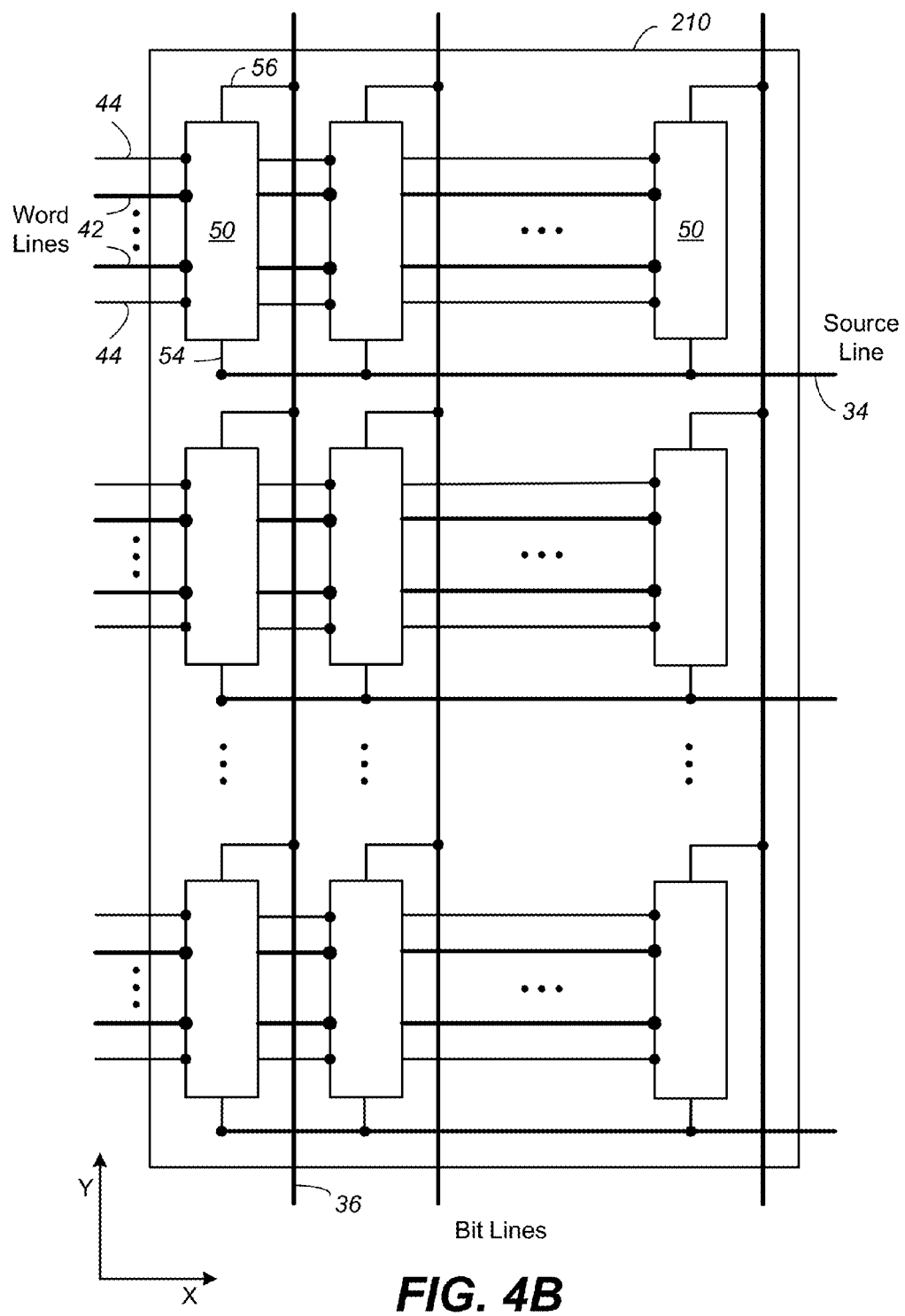
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
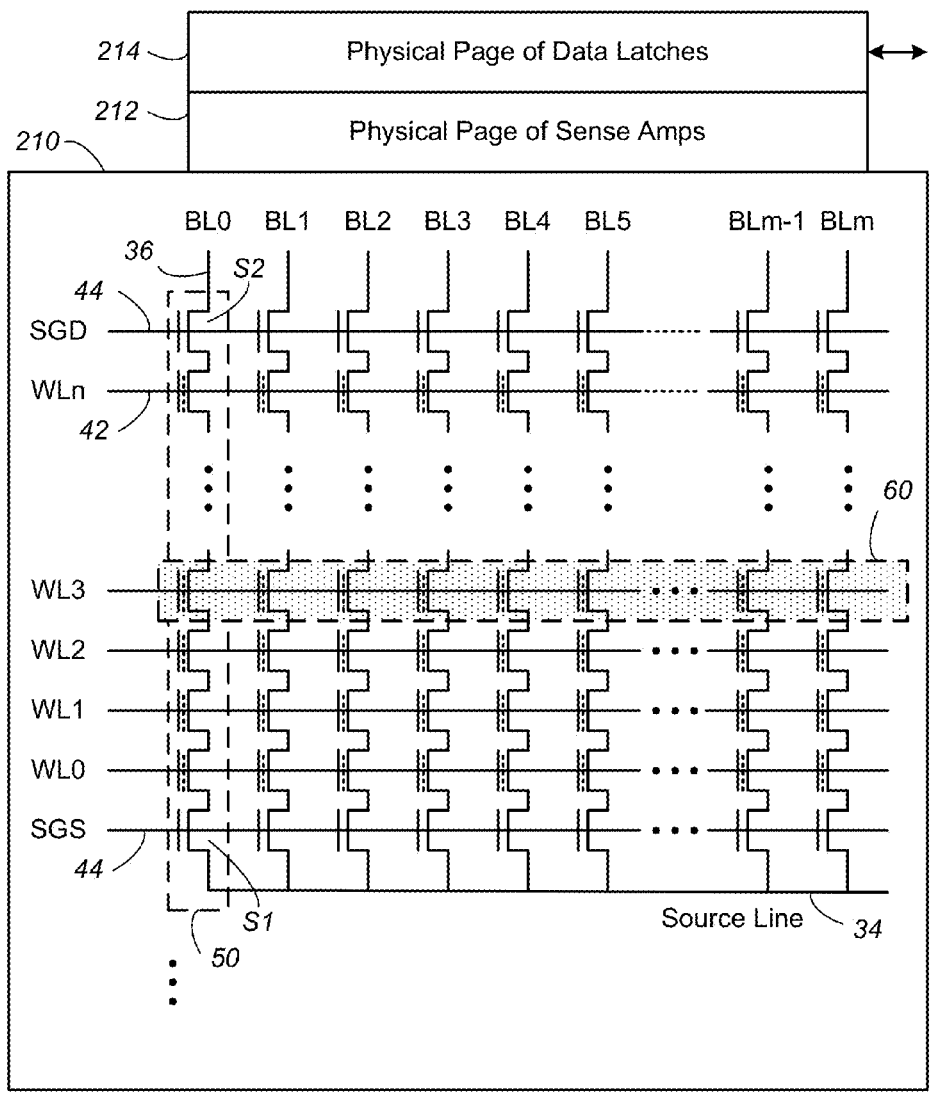
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
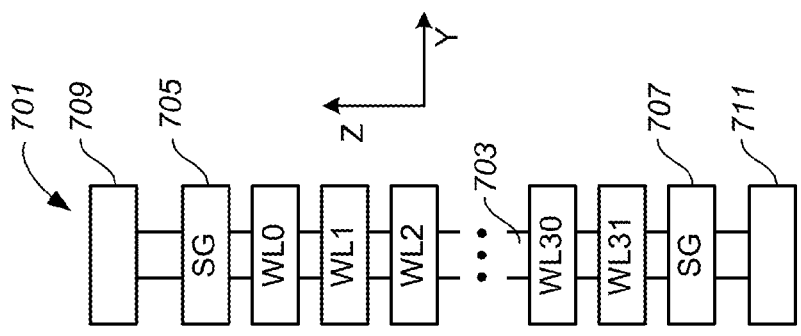
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
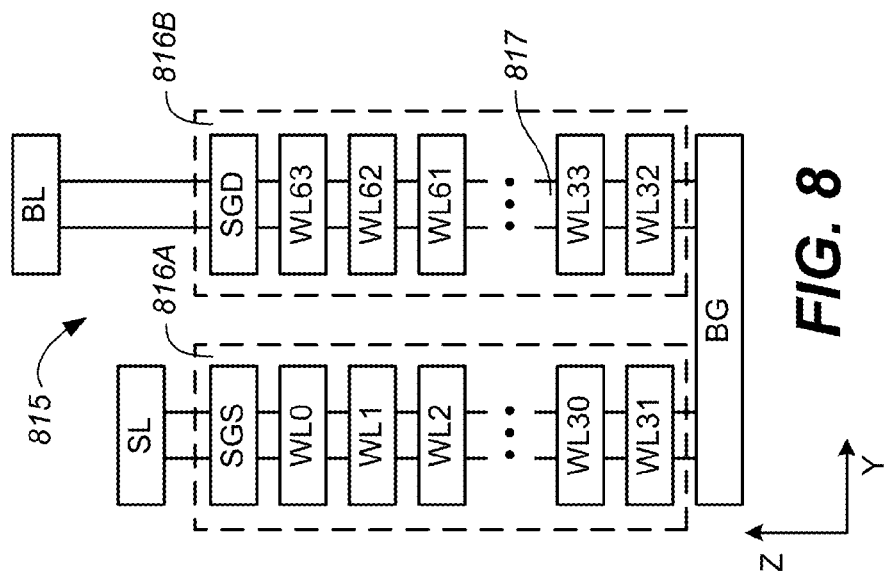
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
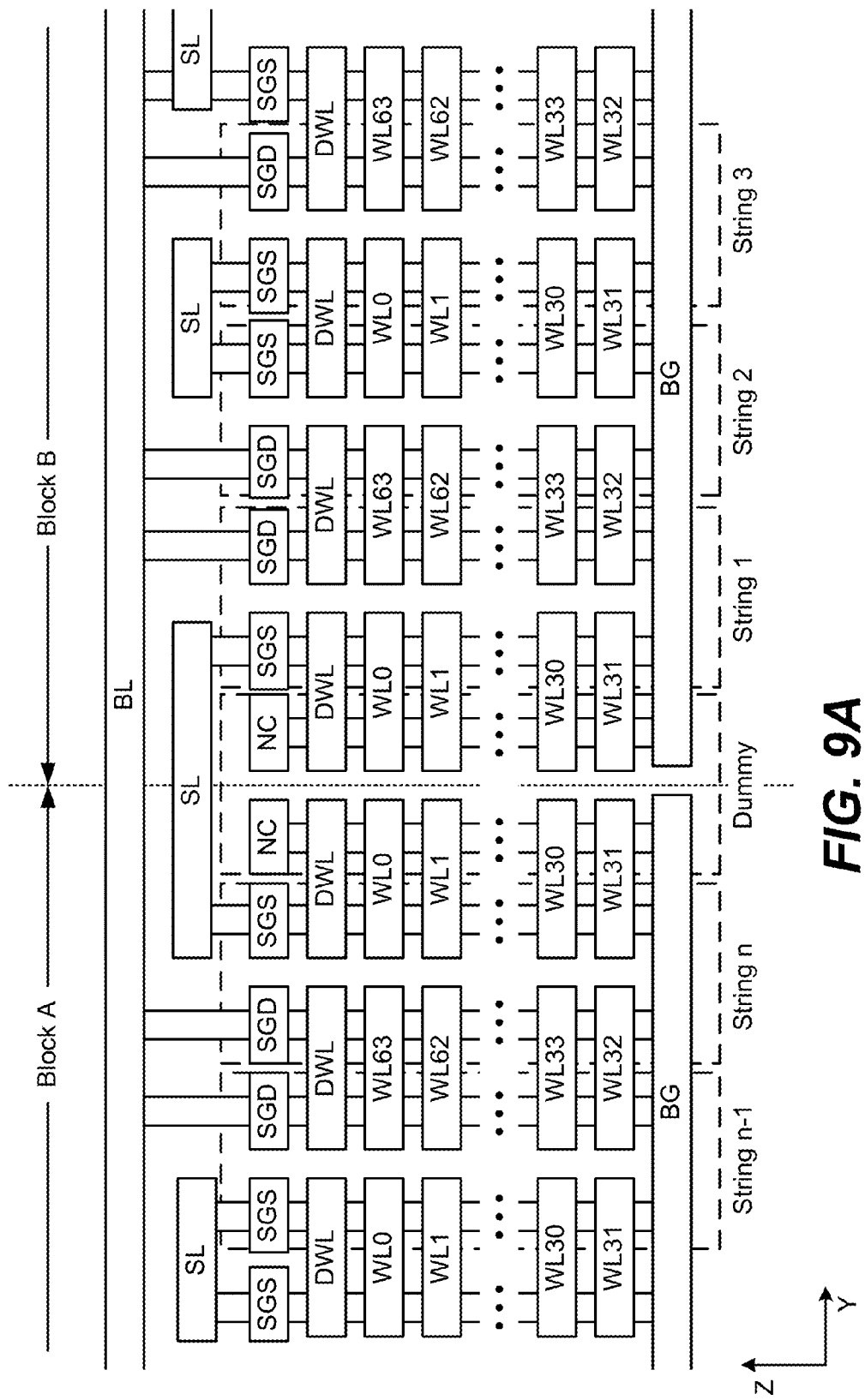
FIG. 9A shows a cross section of a 3-D NAND memory array with U-shaped NAND strings in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. The structure of back gates is further explained below.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 9B:
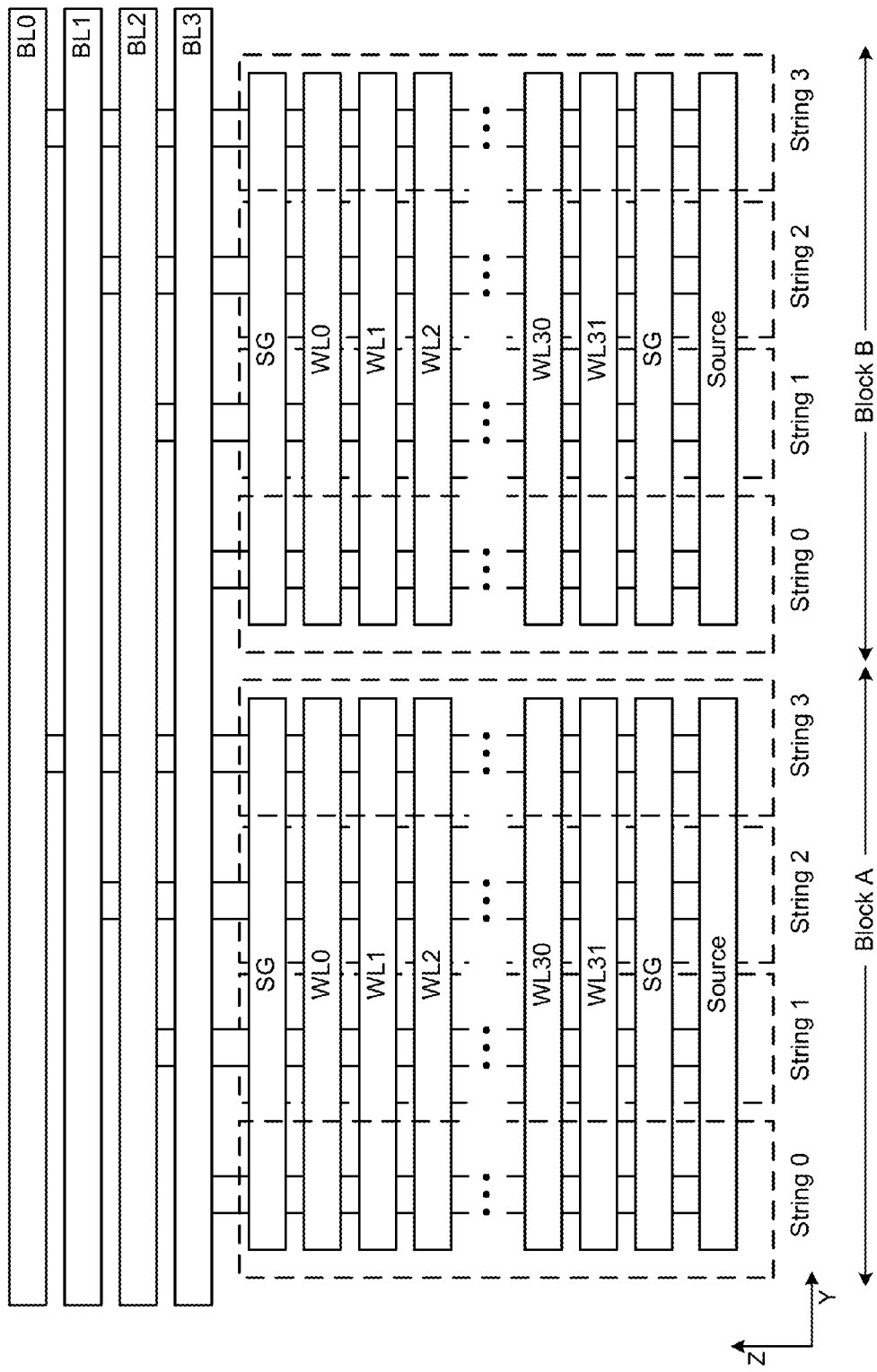
FIG. 9B shows a cross section of a 3-D NAND memory with straight NAND strings in the y-z plane.

FIG. 9B shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Thus, WL0 of each string in a block is formed from the same portion of conductive material. Memory hole structures extend down through these sheets of conductive material to form memory cells.

FIG. 10A shows a cross section along a y-z plane that intersects memory holes including memory hole 929 so that the structures formed within memory holes (memory hole structures) may be clearly seen. FIG. 10A shows that memory holes are connected together at the bottom by a common source connection. In other examples, back gates or other structures may be provided in or on a substrate at this location.

FIG. 10B shows the structure of a stack of layers in the memory hole 929 where memory cells are formed (the memory hole structure). It can be seen that a blocking dielectric "Block" 181 is deposited on the walls of the memory hole to provide electrical isolation from word lines 180a, 180b. A Charge Trapping Layer (CTL) 183 is deposited on the blocking dielectric 181. The CTL layer 183 forms charge storage elements where the CTL is in close proximity to polysilicon word lines 180a, 180b. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

The memory hole structure of FIG. 10B may be found in memory holes of various vertical NAND strings including U-shaped and straight NAND strings. Different memory designs use different arrangements of bit lines, source lines, and select lines to access memory cells. Aspects of the present invention may be applied to various memory designs that have some variation in memory cells between physical levels due to memory hole geometry or otherwise.

One difference between a three dimensional memory array and a two dimensional memory array is that certain physical dimensions of memory cells may vary with the location of the memory cells in the vertical direction. While memory cells in a planar array may be made by process steps that generally have uniform effect across the plane of the substrate, some steps in formation of three dimensional memory arrays are not uniform from layer to layer and may also have significant non-uniformity laterally across a substrate. For example, memory holes may be formed by etching down through multiple layers using an appropriate anisotropic etch. However, such holes may not be perfectly uniform from top to bottom because of the high aspect ratio that is typical of such memory holes. In general, such memory holes are wider towards the top than the bottom. Or, they may be widest somewhere near the top with some narrowing towards the top. Also, while memory holes may be relatively uniform in shape and position at the top (close to the masking layer that defines them) they may become less uniform lower down. For example, memory holes may be uniformly circular in cross section with the same diameter at the top but may deviate from a circular shape (becoming oval or otherwise distorted from circular) at lower levels and may show significant variation from memory hole to memory hole.

Figures 11A, 11B, 11C:
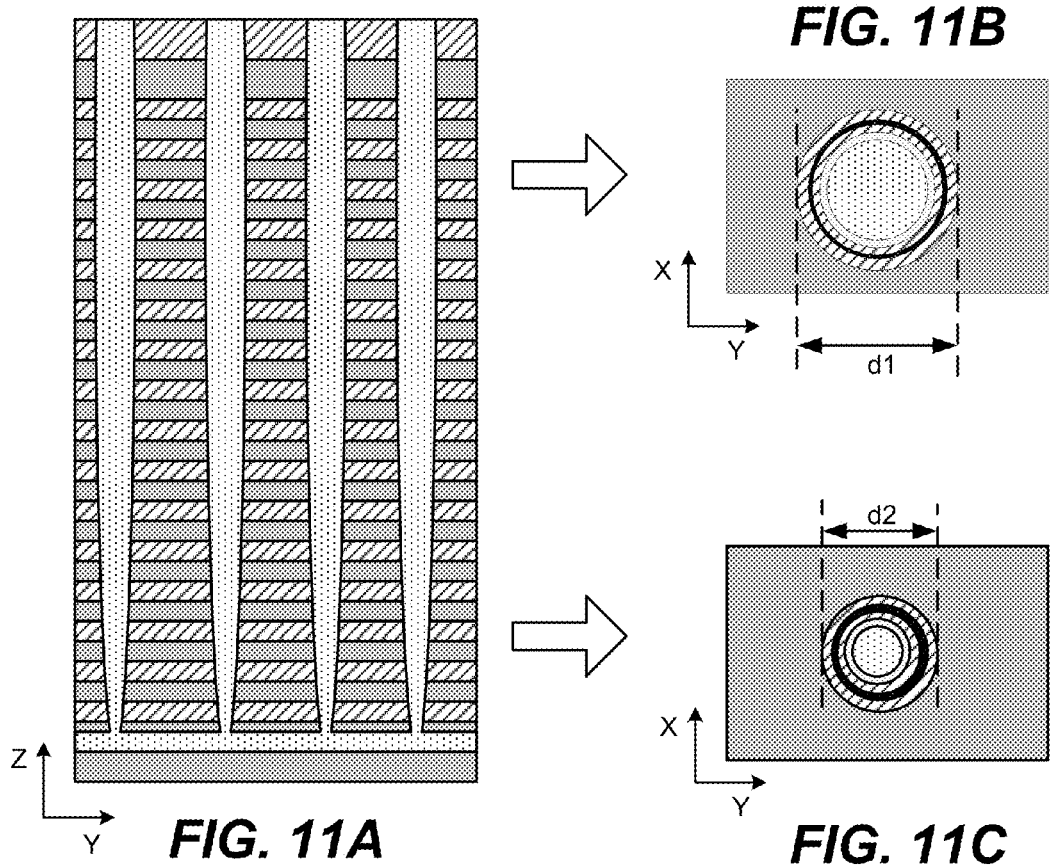
FIG. 11A shows variation in memory hole diameter.
FIG. 11B shows a cross section of a memory hole in an upper level.
FIG. 11C shows a cross section of a memory hole in a lower level.

FIG. 11A shows an example of how memory hole diameter may vary with vertical distance from the substrate. Memory holes are narrower towards the bottom of the memory hole compared with the top of the memory hole. FIG. 11B shows a cross section of a memory hole having a relatively large diameter, d1, for example near the top of a memory hole (relatively far from the substrate). FIG. 11C shows a cross section of a memory hole having a relatively small diameter, d2, for example near the bottom of a memory hole (relatively near the substrate). Diameter d2 is significantly less than diameter d1 which leads to a significantly stronger electric field within the memory hole of FIG. 11C compared with FIG. 11B under the same conditions (e.g. when the same voltage applied to the word line). A higher electric field affects the characteristics of memory cells. For example, programming and erase may be faster for a smaller diameter memory hole under the same conditions. Higher electric field strength may also cause increased wear and earlier failure of memory cells with small memory hole diameters. In addition to memory hole diameter, the various layers that are deposited in memory holes to form memory hole structures may vary with distance from the substrate because of different process conditions experienced at the bottoms and tops of such high aspect ratio memory holes.

Knowledge of memory hole diameters at different locations may allow memory operation at those locations to be adapted according to the expected characteristics. U.S. patent application Ser. No. 13/791,200, filed on Mar. 8, 2013, entitled, "Optimized configurable NAND parameters," and corresponding U.S. Provisional Application No. 61/731,198, filed on Nov. 29, 2012, which are hereby incorporated by reference in their entirety, describe predicted memory hole variation and how it may be used to select appropriate parameters for different levels. U.S. patent application Ser. No. 13/801,741, filed on Mar. 13, 2013, entitled, "Weighted read scrub for nonvolatile memory," and corresponding Provisional Application No. 61/731,215, filed on Nov. 29, 2012, which are hereby incorporated by reference in their entirety, describe prioritizing scrubbing of data according to predicted memory hole size.

Memory hole diameter as a function of location is somewhat predictable because etch chemistry tends to produce larger diameters near the top of an etched memory hole than near the bottom. However, this predictability is limited and there may be significant variation from one memory hole to another. Different dies formed in the same wafer may have memory holes with different profiles. For example, dies near the edge of a wafer may have different memory hole profiles than dies near the center of a wafer. Even within a single die, there may be significant variation from block to block and within blocks. U.S. patent application Ser. No. 14/064,823, filed on Oct. 28, 2013, entitled, "Block structure profiling in three dimensional memory," which is hereby incorporated by reference in its entirety, describes examples of characterizing memory hole structures at different physical levels.

In general, narrowing of memory holes and memory hole variation in lower physical levels of a three dimensional nonvolatile memory may result in more bad bits occurring in data that is stored along word lines that are in lower physical levels compared with similar data that is stored along word lines that are in higher physical levels. This may mean that there is a high risk of data in lower physical levels becoming uncorrectable by ECC compared with data in higher physical levels. U.S. patent application Ser. No. 14/064,887, filed on Oct. 28, 2013, entitled, "Selection of data for redundancy calculation by likely error rate," which is hereby incorporated by reference in its entirety describes examples of redundancy schemes for use in three dimensional nonvolatile memories in which different physical levels have different likely error rates.

RAID Arrangement

In some memory systems, data in a group of blocks is used to calculate redundancy data that is then stored in a redundant block. Subsequently, if data in one of the blocks of the group cannot be read, or cannot be corrected by ECC, then the data can be recovered from the data in the other blocks of the group and the redundant data.

Figure 12:
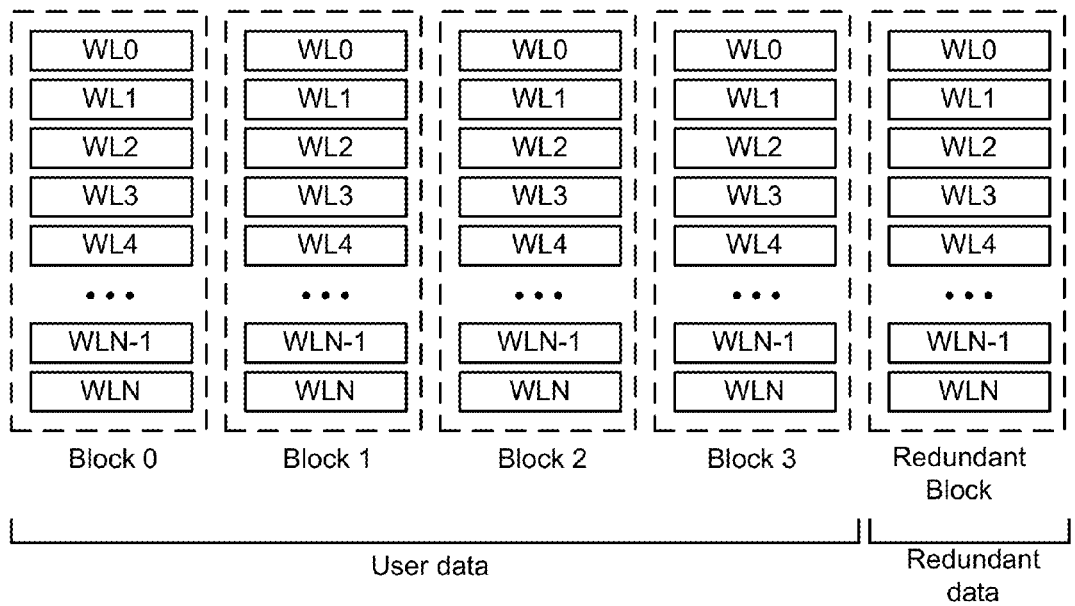
FIG. 12 shows storage of redundant data in a RAID type arrangement.

FIG. 12 shows a simplified example of four blocks (Block 0-Block 3) that contain user data. Each block contains a number of word lines at each physical level which are collectively referred to as WL0-WLN (i.e. all the word lines of the uppermost physical level of a block are referred to as WL0, word lines of the next physical level down are referred to as WL1, and so on, even if the word lines of a level are not formed of a single body). Redundant data is calculated from the user data in blocks 0-3 and is stored in the redundant block. This may be considered a RAID (Redundant Array of Inexpensive Disks) arrangement with data in each block being recoverable from the redundant data and the data from other blocks in the group. The group of blocks including the redundant block may be considered a RAID stripe. Redundant data may be calculated on a level by level and word line by word line basis. Thus, data of WL0 of blocks 0-3 is used to calculate redundant data that is stored in WL0 of the redundant block, data of WL1 of blocks 0-3 is used to calculate redundant data that is stored in WL1 of the redundant block, and so on.

While the RAID arrangement of FIG. 12 provides redundancy for stored data, it is not ideally suited to all situations. In order to recover a portion of data, no more than one corresponding portion of data in another block of the stripe can be bad. This requirement may determine the number of blocks in a group or stripe. Where particular physical levels have high error rates, a RAID scheme should ensure that data in the worst physical level is recoverable. For example, where the error rate for data stored in the lowest physical level (along WLN) is the highest, the RAID scheme may be designed so that data in WLN of no more than one of the blocks 0-3 is likely to become bad. Such a scheme may use relatively small groups or stripes. However, such small stripes may provide more redundancy than needed for higher physical levels that have a lower risk of errors thus wasting space in the memory and wasting resources by calculating more redundant data than is needed.

Figure 13:
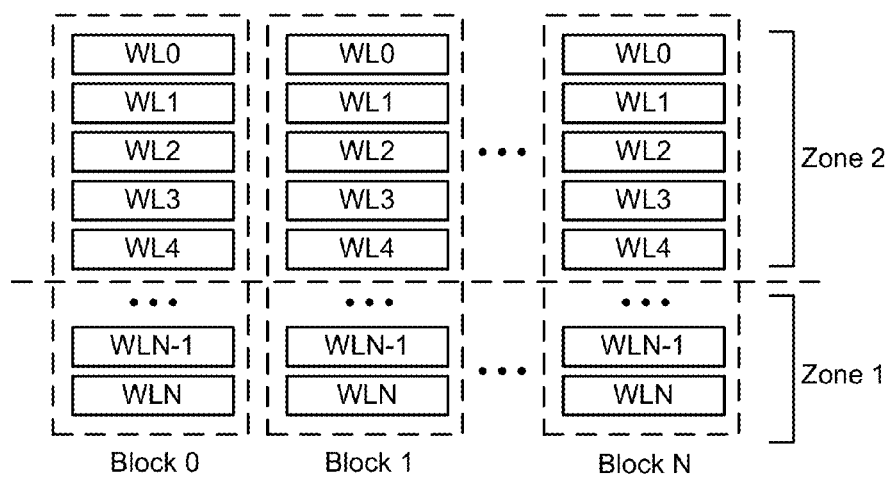
FIG. 13 shows physical levels in a three dimensional memory array in different zones.

According to an aspect of the present invention, the physical levels of a three dimensional memory are categorized into zones and different redundancy schemes are then used for the different zones. FIG. 13 shows an example where a group of blocks 0-N are categorized into Zone 1, containing the lower physical levels, which have a high risk of bad bits and Zone 2 containing the upper physical levels, which have a low risk of bad bits. Because Zone 1 would be expected to have a higher error rate than Zone 2, a higher degree of redundancy may be appropriate for Zone 1 than for Zone 2. In other examples, physical levels may be categorized into three or more zones (up to N different zones corresponding to N physical levels) with different degrees for each zone.

Different degrees of redundancy may be achieved in a number of ways. FIG. 14 shows an example in which physical levels are categorized into three zones (Zone 1-Zone 3) with different redundancy schemes being applied to each. In particular, in Zone 1, blocks 0-N form a RAID stripe 422, while in Zone 2, blocks 0-N+X form RAID stripe 424. The value of N may be chosen so that the probability of data of more than one of blocks 0-N in Zone 1 becoming uncorrectable is acceptably low. Similarly, the value of N+X may be chosen so that the probability of data of more than one of blocks 0-N+X in Zone 2 becoming uncorrectable is acceptably low. The values of N and X may depend on many factors including physical geometry of the memory, programming and reading schemes, and ECC correction schemes. For example, X may be greater than or equal to N in some cases. Because Zone 2 has a lower risk of bad bits than Zone 1, a larger RAID stripe may be used in Zone 2 compared with Zone 1. This is more efficient than applying the same degree of redundancy to all physical levels because less redundant data is stored in the memory overall thus saving space and reducing overhead required for writing redundant data. In other examples, more zones may be used with different sized RAID stripes.

In FIG. 14, Zone 3 has no RAID stripe because no redundant data is calculated for Zone 3. In this example, because Zone 3 has a low risk of bad bits, calculation of redundant data for Zone 3 is omitted. When bad bits occur in Zone 3, they are likely to occur in small numbers that can be corrected by ECC.

While the examples above show physical levels categorized into zones in a uniform manner, this may not always be the case. In some cases, categorization may be performed on a block-by-block basis. For example, in one block, only the bottom two physical levels (WLN, and WLN-1 of FIG. 13) may be categorized in Zone 1 while in another block more than two physical levels may be categorized in Zone 1. While this may add complexity it may provide a redundancy scheme that is better adapted to the expected error rate (which may vary from block to block).

Redundant data may be stored in any suitable manner. While some RAID type systems use blocks that are dedicated to storage of redundant data this may not always be appropriate. Some blocks may store both user data and redundant data. For example, in the example of FIG. 14 no redundant data is generated in Zone 3. A block used to store redundant data for Zone 1 and/or Zone 2 may have space available as a result and user data may be stored in this space.

In some cases, categorization of physical layers into zones may be performed as part of initialization of a memory system and may remain fixed throughout the lifecycle of the product. In other cases, categorization of layers into zones may occur after some use so that zones are dynamic, changing over time to adapt to changing error rates in different physical levels. Similarly, the degree of redundancy associated with a zone may be fixed or may change over time to adapt to changing error rates. As a memory experiences wear, error rates tend to increase so that higher degrees of redundancy may be required. Thus, for example, in FIG. 14, some redundant data might be calculated for Zone 3 after a significant amount of wear. The number of blocks in a RAID stripe may increase so that, for example, RAID stripe 422 of Zone 1 might be reduced in size to N-Y at some point. This change could be triggered by a write-erase cycle count (hot count) reaching a particular value, or by an increased number of errors, or some other condition. The reduction in size, Y, and corresponding increase in the degree of redundancy may be based on observed error rates and/or other factors.

Redundant data may be generated from user data in a number of ways. One way to generate redundant data is by applying an Exclusive OR (XOR) operation to portions of user data to generate XOR data. FIG. 16A shows an XOR gate 164 schematically with two inputs A and 13, and an output C. FIG. 16B shows a truth table for XOR gate 164. An XOR operation may be considered a modulo 2 counting operation in which the output reflects whether the sum of the inputs is odd or even. Output bits from an XOR operation may be considered parity bits and XOR data may be considered parity data. While FIGS. 16A-B show two inputs, any number of portions of data may be XORed together to provide XOR data. When a portion of user data is stored and is later read and found to be uncorrectable, the XOR operation may be reversed, i.e. the XOR data is provided as an input, along with remaining good portions of user data, and an XOR operation is performed to generate a good copy of the data.

FIG. 16 illustrates an example of zone based redundancy. Physical levels in a three dimensional nonvolatile memory are categorized into zones 630 based on expected error rates for data stored in the physical levels. Subsequently, appropriate redundancy schemes with different degrees of redundancy are selected for each zone 632. This may include selecting zero redundancy for a zone that has a low expected error rate.

Figure 17:
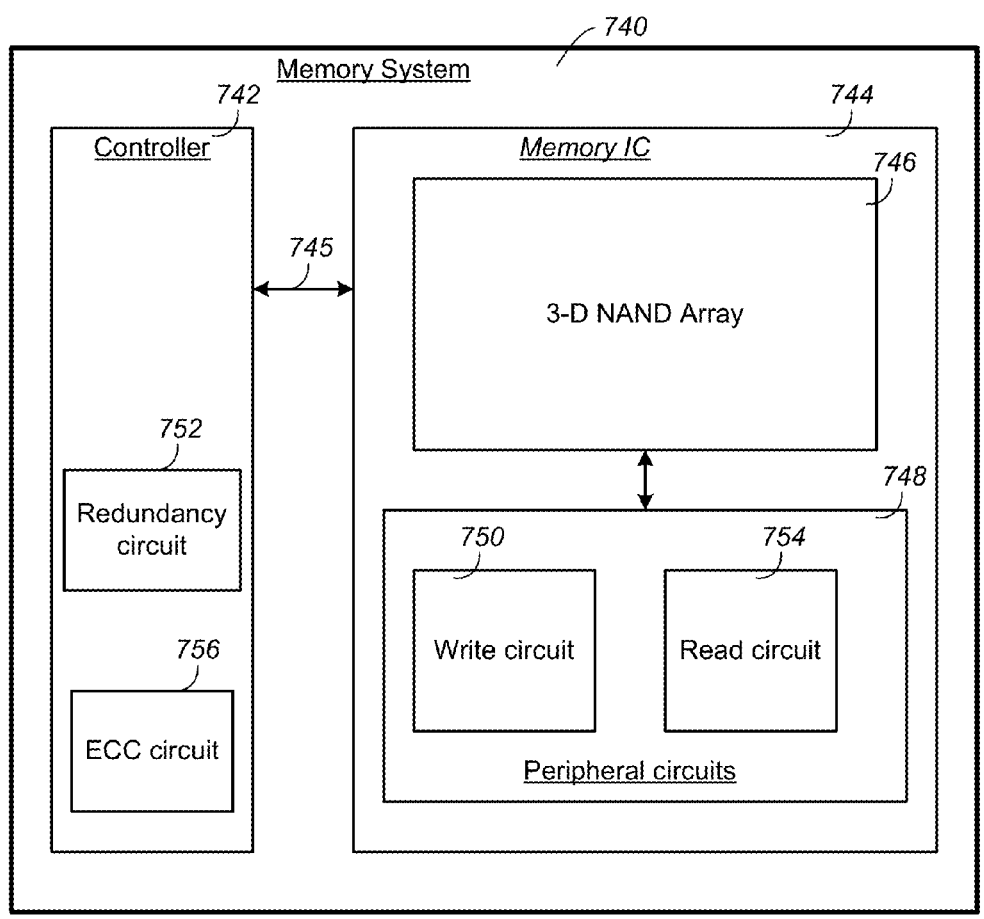
FIG. 17 shows an example of a memory system with adaptive redundancy.

FIG. 17 shows an example of hardware that may be used to implement aspects of the present invention. In particular, FIG. 17 shows memory system 740 which includes a memory controller 742 and a memory Integrated Circuit (IC) 744 connected by a bus 745. It will be understood that additional memory ICs may be connected to memory controller 742 by bus 745, and/or by additional busses. Memory IC 744 includes a three-dimensional nonvolatile NAND memory array 746 that is monolithically formed in two or more physical layers of memory cells disposed above a substrate. The physical layers are categorized into zones according to expected error rates. Memory IC 744 also includes peripheral circuits 748, including write circuit 750 and read circuit 754. Memory controller 742 includes redundancy circuit 752, which may include an XOR circuit to generate XOR data from portions of user data. Memory controller 742 also includes ECC circuit 756 which may encode data prior to storage and subsequently correct errors (when possible) when the data is read from the memory. ECC circuit 756 may also indicate when a portion of data is uncorrectable, in which case redundancy circuit 752 may generate the portion of data from XOR data and remaining good data.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three-dimensional nonvolatile memory that is monolithically formed in a plurality of physical levels of memory cells disposed above a substrate, memory cells in the plurality of physical levels connected in series to foim vertical NAND strings, comprising:
categorizing the plurality of physical levels into at least a first category of physical levels and a second category of physical levels according to expected error rate, the first category of physical levels having a first expected error rate, the second category of physical levels having a second expected error rate that is less than the first expected error rate;
performing a redundancy calculation for data in the first category of physical levels, across N blocks of the three-dimensional nonvolatile memory, to generate first redundant data;
storing the first redundant data in a redundant block in the three-dimensional nonvolatile memory;
performing a redundancy calculation for data in the second category of physical levels, across N+X blocks of the three-dimensional nonvolatile memory, to generate second redundant data; and
storing the second redundant data in the redundant block.

2. The method of claim 1 wherein the categorizing into at least the first category and the second category includes categorizing into a third category that has a third expected error rate that is less than the first and second expected error rates and wherein no redundancy calculation is performed for data in the third category of physical levels.

3. The method of claim 1 wherein X is greater than or equal to N.

4. The method of claim 1 wherein the physical levels of the first category are physically located below the physical levels of the second category.

5. The method of claim 2 wherein the third category of physical levels includes uppermost physical levels of the three-dimensional nonvolatile memory.

6. The method of claim 1 wherein memory hole diameter is less in the first category of physical levels than in the second category of physical levels.

7. The method of claim 1 wherein performing the redundancy calculation for data in the first category of physical levels across N blocks includes performing an Exclusive OR (XOR) operation on user data in the first category of physical blocks across the N blocks to generate first XOR data.

8. The method of claim 7 further comprising:
subsequently reversing the XOR operation in order to generate a copy of a portion of the user data from the first XOR data and from other portions of the user data.

9. The method of claim 8 wherein the subsequent reversing of the XOR operation is performed in response to a determination that the portion of data in physical levels of the first category is uncorrectable by Error Correction Code.

10. A three-dimensional nonvolatile NAND memory system comprising:
a three-dimensional nonvolatile NAND memory that is monolithically formed in a plurality of physical levels of memory cells disposed above a substrate, the plurality of physical levels including high risk physical levels in which there is a high risk of bad bits and low risk physical levels in which there is a low risk of bad bits;
a plurality of memory hole structures extending vertically through the plurality of physical levels to connect memory cells of the plurality of physical levels into vertical NAND strings, the plurality of memory hole structures having small diameters in the high risk physical levels and having large diameters in the low risk physical levels; and
a redundancy circuit that is configured to generate redundant data with different degrees of redundancy for high risk physical levels and low risk physical levels.

11. The three-dimensional nonvolatile NAND memory system of claim 10 wherein the redundancy circuit comprises an exclusive OR (XOR) circuit on the substrate, which is configured to generate XOR data with different degrees of redundancy by XORing different numbers of blocks for high risk physical levels and low risk physical levels.

12. The three-dimensional NAND memory system of claim 10 further comprising an Error Correction Code (ECC) circuit that is configured to encode data prior to storage in the three-dimensional nonvolatile NAND memory, configured to decode data that is read from the three-dimensional nonvolatile NAND memory, and configured to identify when data that is read from the three-dimensional NAND memory is uncorrectable.

13. The three-dimensional NAND memory system of claim 12 wherein the redundancy circuit is further configured to regenerate a portion of data when the portion of data is identified as uncorrectable by the ECC circuit.

14. The three-dimensional NAND memory system of claim 10 further comprising:
a redundant block that is dedicated to storage of redundant data; and
a write circuit on the substrate that is configured to write the redundant data from the redundancy circuit in the redundant block.

15. The three-dimensional NAND memory system of claim 10 wherein the plurality of physical levels further includes medium risk levels that are physically located between the high risk physical levels and the low risk physical levels, the medium risk levels having memory hole diameters that are intermediate between memory hole diameters in high risk physical levels and memory hole diameters in low risk physical levels.

16. A method of operating a three-dimensional nonvolatile memory that is monolithically formed in a plurality of physical levels of memory cells disposed above a substrate, memory cells in the plurality of physical levels connected in series to form vertical NAND strings, comprising:
categorizing the plurality of physical levels into at least a first category of physical levels and a second category of physical levels according to expected error rate, the first category of physical levels having a first expected error rate, the second category of physical levels having a second expected error rate that is less than the first expected error rate, physical levels of the first category being physically located between physical levels of the second category and the substrate;

performing a first Exclusive OR (XOR) calculation for data in the first category of physical levels, across N blocks of the three-dimensional nonvolatile memory, to generate first redundant data;

storing the first redundant data in the three-dimensional nonvolatile memory;

performing a second XOR calculation for data in the second category of physical levels, across N+X blocks of the three-dimensional nonvolatile memory, to generate second redundant data; and storing the second redundant data in the three-dimensional nonvolatile memory.

17. A three-dimensional nonvolatile NAND memory system comprising:

a three-dimensional nonvolatile NAND memory that is monolithically formed in a plurality of physical levels of memory cells disposed above a substrate, the plurality of physical levels including high risk physical levels in which there is a high risk of bad bits and low risk physical levels in which there is a low risk of bad bits;

a plurality of memory hole structures extending vertically through the plurality of physical levels to connect memory cells of the plurality of physical levels into vertical NAND strings, the plurality of memory hole structures having small diameters in the high risk physical levels and having large diameters in the low risk physical levels;

an Error Correction Code (ECC) circuit that is configured to encode data prior to storage in the three-dimensional nonvolatile NAND memory, configured to decode data that is read from the three-dimensional nonvolatile NAND memory, and configured to identify when data that is read from the three-dimensional NAND memory is uncorrectable; and an XOR circuit that is configured to generate XOR data with different degrees of redundancy for high risk physical levels and low risk physical levels, and configured to regenerate a portion of data from XOR data when the ECC circuit identifies the portion of data as uncorrectable.

* * * * *